US008652924B2

(12) United States Patent
Song et al.

(10) Patent No.: US 8,652,924 B2
(45) Date of Patent: Feb. 18, 2014

(54) METHODS OF FABRICATING A STORAGE NODE IN A SEMICONDUCTOR DEVICE AND METHODS OF FABRICATING A CAPACITOR USING THE SAME

(75) Inventors: Han Sang Song, Seoul (KR); Jong Kook Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 13/396,451

(22) Filed: Feb. 14, 2012

(65) Prior Publication Data

US 2012/0208340 A1 Aug. 16, 2012

(30) Foreign Application Priority Data

Feb. 15, 2011 (KR) ........................ 10-2011-0013478

(51) Int. Cl.
*H01L 21/20* (2006.01)
*H01L 21/44* (2006.01)

(52) U.S. Cl.
USPC ......................................... 438/386; 438/666

(58) Field of Classification Search
None
See application file for complete search history.

(56) References Cited

FOREIGN PATENT DOCUMENTS

| KR | 102005002038 A | 7/2005 |
| KR | 1020050002004 A | 7/2005 |
| KR | 1020090106907 A | 10/2009 |

*Primary Examiner* — Scott B Geyer
(74) *Attorney, Agent, or Firm* — William Park & Associates Patent Ltd.

(57) ABSTRACT

A storage node is formed in a semiconductor device by forming an interlayer insulation layer on a substrate, forming an etch stop layer and a first sacrificial layer on the interlayer insulation layer, patterning the first sacrificial layer and the etch stop layer to form a first sacrificial layer pattern and an etch stop layer pattern that define a storage node contact hole, forming a recessed first storage node conductive pattern that conformally covers a lower sidewall and a bottom surface of the storage node contact hole, forming a second storage node conductive pattern that includes a first portion surrounded by the recessed first storage node conductive pattern and a second portion conformally covering an upper sidewall of the storage node contact hole, and removing the first sacrificial layer pattern. The recessed first storage node conductive pattern and the second storage node conductive pattern constitute a storage node.

17 Claims, 9 Drawing Sheets

METHODS OF FABRICATING A STORAGE NODE IN A SEMICONDUCTOR DEVICE AND METHODS OF FABRICATING A CAPACITOR USING THE SAME

CROSS-REFERENCES TO RELATED APPLICATIONS

The present application claims priority under 35 U.S.C. 119(a) to Korean Application No. 10-2011-0013478 filed on Feb. 15, 2011 in the Korean intellectual property Office, which is incorporated by reference in its entirety.

BACKGROUND

Exemplary embodiments of the present disclosure relate to methods of fabricating a semiconductor device and, more particularly, to methods of fabricating a storage node in a semiconductor device and methods of fabricating a capacitor using the same.

As semiconductor devices become more highly integrated, a planar area of a unit cell of the semiconductor devices is reduced. Thus, when the highly integrated semiconductor devices are dynamic random access memory (DRAM) devices including cell capacitors, it may be difficult to obtain sufficient cell capacitance necessary for reliable operation of the DRAM devices. Accordingly, various technologies for reducing a thickness of a dielectric layer of the cell capacitors and/or for realizing three dimensional storage nodes have been developed to increase the cell capacitance in a limited planar area. For example, concave storage nodes or cylindrical storage nodes have been proposed for the three dimensional storage nodes.

SUMMARY

Exemplary embodiments are directed to methods of fabricating a storage node in a semiconductor device and methods of forming a capacitor using the same.

According to some embodiments of the invention, a method of fabricating a storage node includes forming an interlayer insulation layer on a substrate, sequentially forming an etch stop layer and a first sacrificial layer on the interlayer insulation layer, patterning the first sacrificial layer and the etch stop layer to form a first sacrificial layer pattern and an etch stop layer pattern that define a storage node contact hole, forming a recessed first storage node conductive pattern that conformally covers a lower sidewall and a bottom surface of the storage node contact hole, forming a second storage node conductive pattern that includes a first portion surrounded by the recessed first storage node conductive pattern and a second portion conformally covering an upper sidewall of the storage node contact hole, and removing the first sacrificial layer pattern. The recessed first storage node conductive pattern and the second storage node conductive pattern constitute a storage node.

The storage node contact hole may be formed to have a depth of at least 18000 angstroms (Å).

The recessed first storage node conductive pattern may be formed of a titanium nitride (TiN) layer. The titanium nitride (TiN) layer may be formed to a thickness of about 50 angstroms (Å) to about 150 angstroms (Å) using, for example, an atomic layer deposition (ALD) process or a chemical vapor deposition (CVD) process.

The recessed first storage node conductive pattern may be formed to have a height of about 3000 (Å) to about 7000 angstroms (Å).

The recessed first storage node conductive pattern may be formed to have a cylindrical shape. Forming the recessed first storage node conductive pattern may include forming a first storage node conductive layer on a surface of the substrate including the storage node contact hole, forming a second sacrificial layer on the first storage node conductive layer, planarizing the second sacrificial layer and the first storage node conductive layer to form a first storage node conductive pattern in the storage node contact hole and a second sacrificial layer pattern surrounded by the first storage node conductive pattern, recessing the first storage node conductive pattern, and removing the second sacrificial layer pattern to expose an inner surface of the recessed first storage node conductive pattern. The second sacrificial layer may be formed of a material having an etch selectivity with respect to the first storage node conductive layer. The first storage node conductive layer may be formed of a titanium nitride layer and the second sacrificial layer may be formed of a polysilicon layer. The first storage node conductive pattern may be recessed using a cleaning process that employs a sulfuric acid ($H_2SO_4$) solution as a cleaning solution. The second sacrificial layer pattern may be removed using a wet etching process that employs an ammonium hydroxide ($NH_4OH$) solution as a wet etchant. The ammonium hydroxide ($NH_4OH$) solution may be formed by mixing de-ionized water ($H_2O$) and ammonia ($NH_3$) in a volume ratio of about 1:5 to about 1:30.

The recessed first storage node conductive pattern and the second storage node conductive pattern may be formed of the same type of material.

The second storage node conductive pattern may be formed to a thickness of about 100 Å to about 200 Å.

The first sacrificial layer pattern may be removed using a full dip out process.

According to further embodiments of the invention, a method of fabricating a storage node includes forming an interlayer insulation layer on a substrate, sequentially forming an etch stop layer and a sacrificial layer on the interlayer insulation layer, patterning the sacrificial layer and the etch stop layer to form a sacrificial layer pattern and an etch stop layer pattern that define a storage node contact hole, forming a storage node conductive pattern that conformally covers a sidewall and a bottom surface of the storage node contact hole, forming a recessed conductive pattern that fills a lower portion of the storage node contact hole surrounded by the storage node conductive pattern, forming a metal layer on a top surface of the recessed conductive pattern, and removing the sacrificial layer pattern. The metal layer, the recessed conductive pattern, and the storage node conductive pattern constitute a storage node.

The storage node contact hole may be formed to have a depth of at least 18000 angstroms (Å).

The storage node conductive pattern may be formed of a titanium nitride (TiN) layer. The titanium nitride (TiN) layer may be formed to a thickness of about 50 angstroms (Å) to about 150 angstroms (Å) using an atomic layer deposition (ALD) process or a chemical vapor deposition (CVD) process.

Forming the recessed conductive pattern may include forming a conductive pattern filling the storage node contact hole surrounded by the storage node conductive pattern and recessing the conductive pattern to leave a portion of the conductive pattern in a lower portion of the storage node contact hole. The conductive pattern may be formed of a material having an etch selectivity with respect to the storage node conductive pattern. The storage node conductive pattern may be formed of a titanium nitride layer and the conductive pattern may be formed of a polysilicon layer. The conductive pattern may be recessed using a wet etching process that employs an ammonium hydroxide (NH$_4$OH) solution as a wet etchant. The ammonium hydroxide (NH$_4$OH) solution may be formed by mixing de-ionized water (H$_2$O) and ammonia (NH$_3$) in a volume ratio of about 1:5 to about 1:30.

The recessed conductive pattern may be formed to have a height of about 3000 Å to about 7000 Å.

The metal layer may be formed using a physical vapor deposition (PVD) process.

The metal layer may be formed of a titanium nitride layer and may be formed to a thickness of about 50 Å to about 100 Å.

According to some other embodiments of the invention, a method of fabricating a capacitor includes forming an interlayer insulation layer on a substrate, sequentially forming an etch stop layer and a first sacrificial layer on the interlayer insulation layer, patterning the first sacrificial layer and the etch stop layer to form a first sacrificial layer pattern and an etch stop layer pattern that define a storage node contact hole, forming a recessed first storage node conductive pattern that conformally covers a lower sidewall and a bottom surface of the storage node contact hole, forming a second storage node conductive pattern that includes a first portion surrounded by the recessed first storage node conductive pattern and a second portion conformally covering an upper sidewall of the storage node contact hole, removing the first sacrificial layer pattern, forming a dielectric layer on a surface of the substrate where the first sacrificial layer pattern is removed, and forming a plate node on the dielectric layer. The recessed first storage node conductive pattern and the second storage node conductive pattern constitute a storage node.

Forming the recessed first storage node conductive pattern may include forming a first storage node conductive layer on a surface of the substrate including the storage node contact hole, forming a second sacrificial layer on the first storage node conductive layer, planarizing the second sacrificial layer and the first storage node conductive layer to form a first storage node conductive pattern in the storage node contact hole and a second sacrificial layer pattern surrounded by the first storage node conductive pattern, recessing the first storage node conductive pattern, and removing the second sacrificial layer pattern to expose an inner surface of the recessed first storage node conductive pattern.

According to some further embodiments, a method of fabricating a capacitor includes forming an interlayer insulation layer on a substrate, sequentially forming an etch stop layer and a sacrificial layer on the interlayer insulation layer, patterning the sacrificial layer and the etch stop layer to form a sacrificial layer pattern and an etch stop layer pattern that define a storage node contact hole, forming a storage node conductive pattern that conformally covers a sidewall and a bottom surface of the storage node contact hole, forming a recessed conductive pattern that fills a lower portion of the storage node contact hole surrounded by the storage node conductive pattern, forming a metal layer on a top surface of the recessed conductive pattern, removing the sacrificial layer pattern, forming a dielectric layer on a surface of the substrate where the sacrificial layer pattern is removed, and forming a plate node on the dielectric layer. The metal layer, the recessed conductive pattern, and the storage node conductive pattern constitute a storage node.

BRIEF DESCRIPTION OF THE DRAWINGS

The above and other features and advantages of the disclosure will become more apparent in view of the attached drawings and accompanying detailed description.

DESCRIPTION OF SPECIFIC EMBODIMENTS

Figure 1:
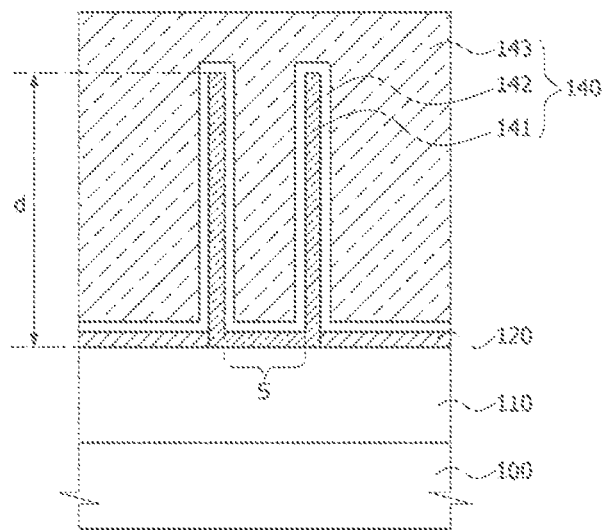
FIG. 1 is a cross sectional view illustrating a typical semiconductor device employing a cylindrical storage node.

Exemplary embodiments will be described more fully with reference to the accompanying drawings. Many different forms and embodiments are possible without deviating from the spirit and teachings of this disclosure and so the disclosure should not be construed as being limited to the exemplary embodiments set forth. Rather, these exemplary embodiments are provided so that this disclosure will be thorough and complete, and will convey the scope of the disclosure to those skilled in the art. In the drawings, the sizes and relative sizes of layers and regions may be exaggerated for clarity. The same reference numerals or the same reference designators denote the same elements throughout the specification.

The term "and/or" includes any and all combinations of one or more of the associated listed items.

FIG. 1 is a cross sectional view illustrating an example of cylindrical storage nodes employed in DRAM devices. Referring to FIG. 1, an interlayer insulation layer 110 may be disposed on a semiconductor substrate 100. An etch stop layer 120 may be stacked on the interlayer insulation layer 110, and a cylindrical storage node 141 may also be stacked on the interlayer insulation layer 110. A vertical wall of the cylindrical storage node 141 may protrude upwardly from a top surface of the etch stop layer 120. Thus, an inner surface and an outer sidewall surface of the cylindrical storage node 141 may be exposed. Although not shown in the drawing, the cylindrical storage node 141 may extend into the interlayer insulation layer 110 to be electrically connected to a contact plug (not shown) formed on the semiconductor substrate 100, and the contact plug may be electrically connected to an impurity region (not shown) disposed in the semiconductor substrate 100. A dielectric layer 142 is disposed to cover the inner surface and the outer sidewall surface of the cylindrical storage node 141. The dielectric layer 142 is covered with a plate node 143. The cylindrical storage node 141, the dielectric layer 142, and the plate node 143 constitute a capacitor 140.

In the event that the cylindrical storage node is employed in the DRAM devices, the dielectric layer 142 may be conformally formed on the inner surface and the outer sidewall surface of the storage node 141 as illustrated in FIG. 1. Thus, an overlap area between the storage node 141 and the plate node 143 may be maximized to increase capacitance of the capacitor 140. As illustrated in FIG. 1, the dielectric layer 142 should be conformally formed on the inner surface of the storage node 141 in order that the plate node 143 sufficiently overlaps with the inner surface of the storage node 141. That is, the storage node 141 should have at least a certain planar area S in order that the plate node 143 sufficiently overlaps with the inner surface of the storage node 141. Accordingly, there may be some limitations in minimizing the planar area S of the storage node 141. In addition, the storage node 141 may be formed by etching a portion of a mold layer (also referred to as a sacrificial layer) to form a trench having a depth substantially corresponding to a height D of the storage node 141, and by depositing a conductive layer on an inner surface of the trench. If the depth D of the trench increases, the trench may have a sloped sidewall because of the nature of the etching process. That is, the width of the storage node 141 may be gradually reduced toward the substrate 100. Thus, there may be still some limitations in minimizing the planar area S that the storage node 141 occupies. That is, there may be still limitations in increasing capacitance of the capacitor 140 in a limited planar area.

Other storage nodes having different structures from the cylindrical storage node may be provided. For example, pillar-shaped storage nodes may be provided. However, a surface area of the pillar-shaped storage node may be less than that of the cylindrical storage node. Thus, the height of the pillar-shaped storage node may need to be increased to compensate for the reduction of capacitance. In the event that the height of the pillar-shaped storage node increases, the burden on etching processes performed in subsequent steps may be increased.

Figure 2:
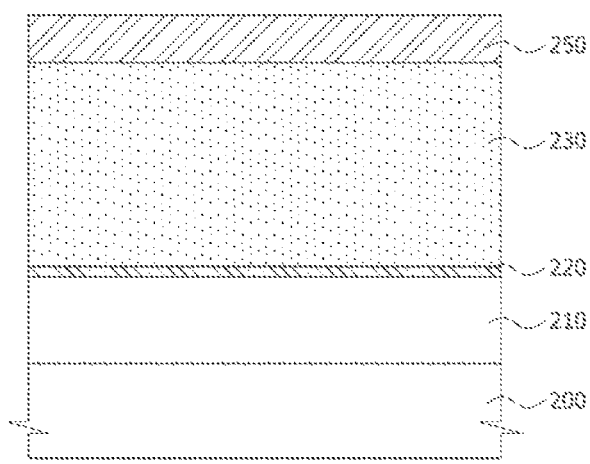
FIGS. 2 to 10 are cross sectional views illustrating an exemplary method of fabricating a storage node in a semiconductor device according to an embodiment of the invention and an exemplary method of fabricating a capacitor using the same.

FIGS. 2 to 10 are cross sectional views illustrating an exemplary method of fabricating a storage node in a semiconductor device according to an embodiment of the invention and an exemplary method of fabricating a capacitor using the same. Referring to FIG. 2, an interlayer insulation layer 210 and an etch stop layer 220 may be sequentially formed on a semiconductor substrate 200 that may be, for example, a silicon substrate. The etch stop layer 220 may be formed of a material layer having an etch selectivity with respect to a sacrificial layer formed in a subsequent process. For example, the etch stop layer 220 may be formed of a nitride layer such as a silicon nitride layer. A first sacrificial layer 230 may be formed on the etch stop layer 220. The first sacrificial layer 230 may be formed to a thickness of at least 18000 angstroms (Å). When the etch stop layer 220 is formed of a nitride layer, the first sacrificial layer 230 may be formed of an oxide layer such as a silicon oxide layer. The first sacrificial layer 230 may be formed of a single layer, as illustrated in FIG. 2. However, the first sacrificial layer 230 may also be formed to have a multi-layered structure. A supporting layer 250 may be formed on the first sacrificial layer 230. The supporting layer 250 may prevent storage nodes formed in a subsequent process from leaning or falling down. The supporting layer 250 and the etch stop layer 220 may be formed, for example, from the same type of material.

Figure 3:
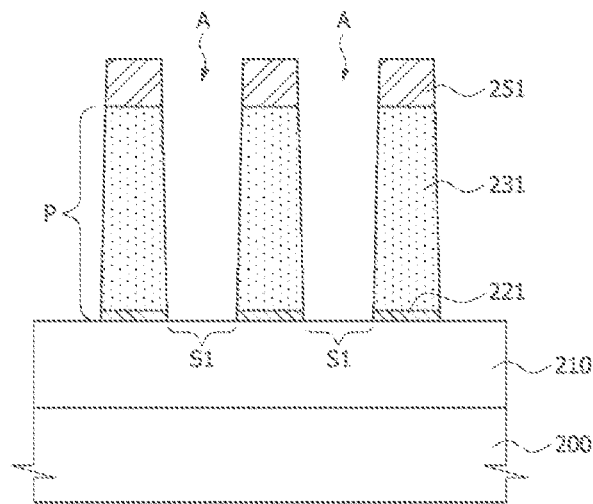

Referring to FIG. 3, after an etch mask pattern (not shown) is formed on the supporting layer 250 (FIG. 2), the supporting layer 250 and the first sacrificial layer 230 (FIG. 2) may be etched using the etch mask pattern as an etch mask. While the first sacrificial layer 230 is etched, the etch stop layer 220 (FIG. 2) may also be etched to expose some portions of the interlayer insulation layer 210. As a result of the etching process, an etch stop layer pattern 221, a first sacrificial layer pattern 231, and a supporting layer pattern 251 may be formed to be sequentially stacked. The etch stop layer pattern 221, the first sacrificial layer pattern 231 and the supporting layer pattern 251 may define a plurality of storage node contact holes A that expose some portions of the interlayer insulation layer 210. As described above, the first sacrificial layer 230 may be formed to have a thickness of at least 18000 Å. Thus, the storage node contact holes A may also be formed to have a depth of at least 18000 Å. If the depth of the storage node contact holes A increases to be more than about 18000 Å without increase of top widths of the storage node contact holes A, a bottom surface of each of the storage node contact holes A may not have a sufficient area S1 to allow a dielectric layer formed in a subsequent process to conformally cover inner surfaces of the storage node contact holes A. This is because the storage node contact holes A are formed to have a sloped sidewall profile P. That is, a width of each of the storage node contact holes A may be gradually reduced toward the interlayer insulation layer 210. The sloped sidewall profile P may be due to the nature of an etching process. Although not shown in the drawings, storage node contacts may be formed to penetrate the interlayer insulation layer 210 and may be electrically connected to impurity regions in the semiconductor substrate 200. In the event that the storage node contacts are disposed in the interlayer insulation layer 210, the storage node contact holes A may be formed to expose respective ones of the storage node contacts.

Figure 4:
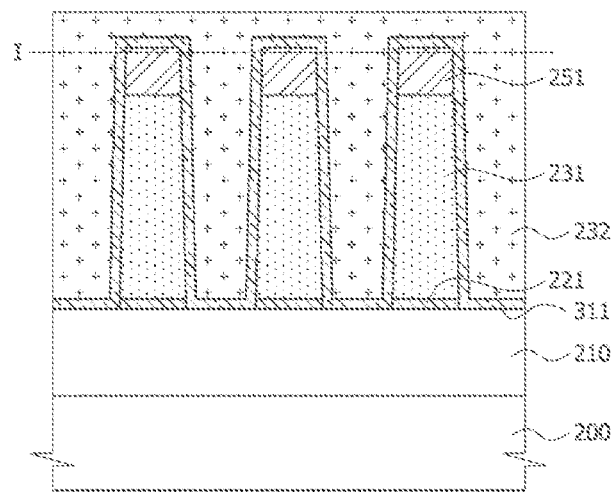

Referring to FIG. 4, a first storage node conductive layer 311 may be formed on the interlayer insulation layer 210 and the storage node contact holes A (FIG. 3). In an exemplary embodiment, the first storage node conductive layer 311 may be formed of a metal layer for an electrode of a capacitor having a metal-insulator-metal (MIM) structure. For example, the first storage node conductive layer 311 may be formed of a metal nitride layer such as a titanium nitride (TiN) layer. In the event that the first storage node conductive layer 311 is formed of a TiN layer, the TiN layer may be formed, for example, to a thickness of about 50 Å to about 150 Å using an appropriate process such as an atomic layer deposition (ALD) process or a chemical vapor deposition (CVD) process. Subsequently, a second sacrificial layer 232 may be formed on the first storage node conductive layer 311. The second sacrificial layer 232 may be formed to fill the storage node contact holes A surrounded by the first storage node conductive layer 311. The second sacrificial layer 232 may be formed of a material layer having an excellent etch selectivity with respect to the first storage node conductive layer 311. For example, when the first storage node conductive layer 311 is formed of a TiN layer, the second sacrificial layer 232 may be formed of a polysilicon layer having an excellent wet etch selectivity with respect to the TiN layer.

Figure 5:
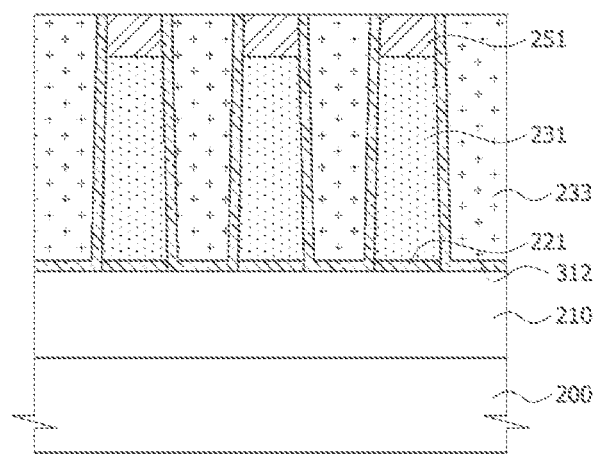

Referring to FIG. 5, the second sacrificial layer 232 and the first storage node conductive layer 311 may be planarized to expose the supporting layer pattern 251. The planarization process may be performed until the materials above a dotted line I (FIG. 4) are removed. The planarization process may be performed using, for example, a chemical mechanical polishing (CMP) process. As a result of the planarization process, the second sacrificial layer 232 and the first storage node conductive layer 311 located above the dotted line I may be removed to form first storage node conductive patterns 312 separated from each other and second sacrificial layer patterns 233 surrounded by the first storage node conductive patterns 312.

Figure 6:
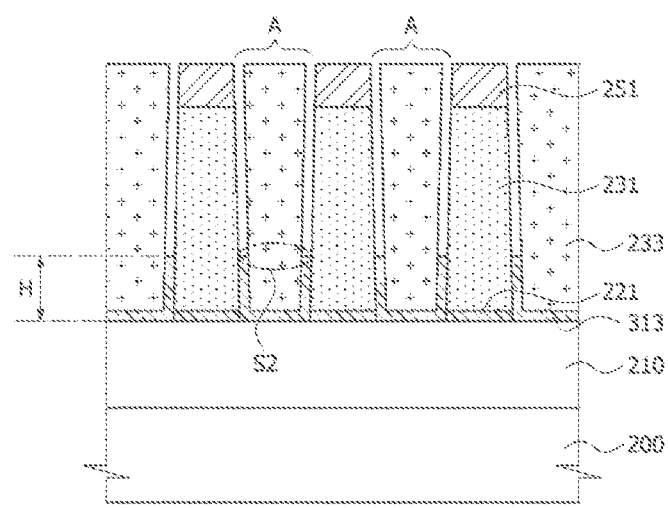

Referring to FIG. 6, the first storage node conductive patterns 312 (FIG. 5) may be recessed to form recessed first storage node conductive patterns 313. Each of the recessed first storage node conductive patterns 313 may be formed to have a cylindrical shape. Portions of sidewalls of the second sacrificial layer patterns 233 may be exposed by forming the recessed first storage node conductive patterns 313. The recess process may be performed using, for example, a cleaning process. If the first storage node conductive patterns 312 are formed of a TiN layer, the first storage node conductive patterns 312 may be recessed using a cleaning solution such as, for example, a sulfuric acid ($H_2SO_4$) solution. The first storage node conductive patterns 312 may be recessed by a predetermined depth such that a horizontal sectional area S2 of each of the storage node contact holes A at the same level as a top surface of the recessed first storage node conductive patterns 313 still has a sufficient area to allow a dielectric layer formed in a subsequent process to conformally cover inner surfaces of the storage node contact holes A on the level of top surface of the recessed first storage node conductive patterns 313. In an embodiment of the invention, when the storage node contact holes A are formed to have a depth of about 18000 Å, the recess process may be performed such that the recessed first storage node conductive patterns 313 have a height of about 3000 Å to about 7000 Å. In the event that the storage node contact holes A are formed to have a depth of about 18000 Å and the recessed first storage node conductive patterns 313 are formed to have a height H less than about 3000 Å, the horizontal sectional area S2 of each storage node contact hole A at the same level as the top surface of the recessed first storage node conductive patterns 313 may not have a sufficient area to allow a dielectric layer formed in a subsequent process to conformally cover inner surfaces of the storage node contact holes A on the level of top surface of the recessed first storage node conductive patterns 313. On the other hand, in the event that the storage node contact holes A are formed to have a depth of about 18000 Å and the recessed first storage node conductive patterns 313 are formed to have the height H greater than about 7000 Å, capacitors completed by subsequent processes may not have sufficient capacitance due to reduction of an overlap area between a plate electrode and each storage node. However, the specific depth range for the storage node contact holes A may depend on the types of materials used for the various components described.

Figure 7:
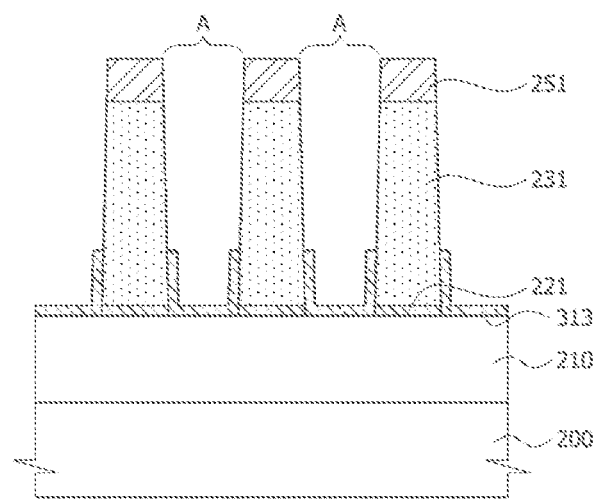

Referring to FIG. 7, the second sacrificial layer patterns 233 may be removed using an etching process. The second sacrificial layer patterns 233 may be removed by supplying, for example, a wet etchant into the recessed regions between the second sacrificial layer patterns 233 and the first sacrificial layer pattern 231 using a wet etching process. When the second sacrificial layer patterns 233 are formed of a polysilicon layer, the second sacrificial layer patterns 233 may be removed using, for example, an ammonium hydroxide ($NH_4OH$) solution as an etchant. The ammonium hydroxide ($NH_4OH$) solution may be formed, for example, by mixing de-ionized water ($H_2O$) and ammonia ($NH_3$) in a volume ratio of about 1:5 to about 1:30. As a result of the removal of the second sacrificial layer patterns 233, the recessed first storage node conductive patterns 313 may be exposed.

Figure 8:
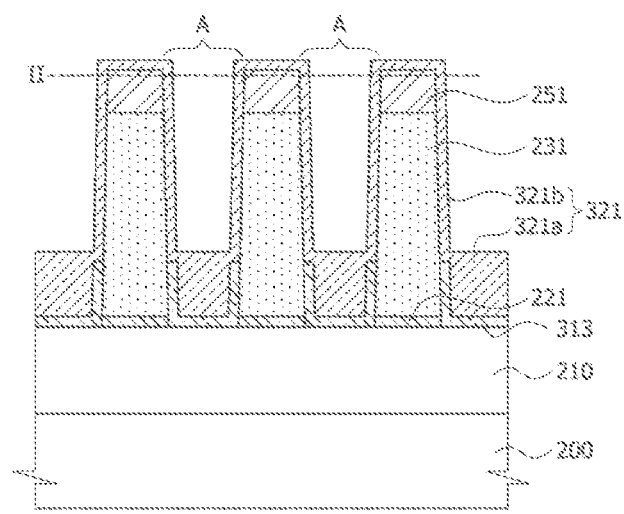

Referring to FIG. 8, a second storage node conductive layer 321 may be formed on an entire surface of the substrate where the second sacrificial layer patterns 233 have been removed. The second storage node conductive layer 321 may be formed to fill inside spaces of the recessed first storage node conductive patterns 313 and to conformally cover surfaces of the first sacrificial layer pattern 231 and the supporting layer pattern 251. That is, the second storage node conductive layer 321 may be formed to include a plurality of first portions 321a filling the inside spaces of the recessed first storage node conductive patterns 313 and a second portion 321b covering the first sacrificial layer pattern 231 and the supporting layer pattern 251. The recessed first storage node conductive patterns 313 and the second storage node conductive layer 321 may constitute storage nodes formed in a subsequent process. Thus, the second storage node conductive layer 321 may be formed of the same material as the recessed first storage node conductive patterns 313. For example, the second storage node conductive layer 321 and the recessed first storage node conductive patterns 313 may be formed of a titanium nitride (TiN) layer. In the event that the second storage node conductive layer 321 is formed of a titanium nitride (TiN) layer, the TiN layer may be formed, for example, to a thickness of about 100 Å to about 200 Å using an atomic layer deposition (ALD) process or a chemical vapor deposition (CVD) process.

Figure 9:
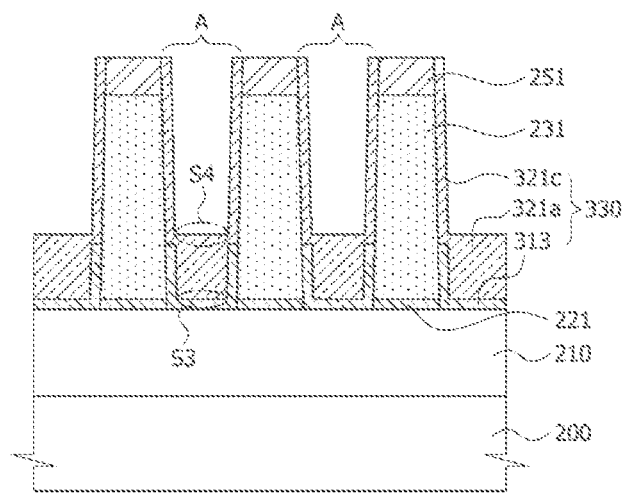

Referring to FIG. 9, the second storage node conductive layer 321 may be planarized to expose the supporting layer pattern 251. The planarization process may be performed until the materials on a level indicated by a dotted line II (FIG. 8) are removed. The planarization process may be performed using, for example, a chemical mechanical polishing (CMP) process. As a result of the planarization process, the second storage node conductive layer 321 located on the level indicated by the dotted line II may be removed to separate the second portion 321b into a plurality of third portions 321c. The recessed first storage node conductive pattern 313, the first portion 321a, and the third portion 321c formed in each of the storage node contact holes A may constitute a storage node 330. As illustrated in FIG. 9, the first portion 321a may have a pillar-shaped structure and the third portion 321c may have a cylindrical structure. Subsequently, the supporting layer pattern 251 may be patterned to form openings that expose some portions of the first sacrificial layer pattern 231, and the first sacrificial layer pattern 231 may be removed using, for example, a full dip out process. According to FIG. 9, the first sacrificial layer pattern 231 is illustrated as if the first sacrificial layer pattern 231 includes a plurality of portions separated from each other. However, the portions of the first sacrificial layer pattern 231 are physically connected to each other when viewed from a three dimensional drawing. Thus, the first sacrificial layer pattern 231 may be removed by supplying an etchant through the openings in the supporting layer pattern 251.

If the depths of the storage node contact holes A are greater than 18000 Å without increase of upper widths, a bottom surface area S3 of each of the recessed first storage node conductive patterns 313 may not be sufficient to allow a dielectric layer and a plate node formed in subsequent processes to conformally cover inner surfaces of the storage node contact holes A, as described with reference to FIG. 3. However, according to an embodiment, a bottom surface area S4 of each of the third portions 321c may be sufficient to allow a dielectric layer and a plate node formed in subsequent processes to conformally cover inner surfaces of the storage node contact holes A on the first portions 321a. The bottom surface area S4 of each third portion 321c may be controlled by varying depths of the recessed regions formed on the recessed first storage node conductive patterns 313, as described with reference to FIG. 6.

Figure 10:
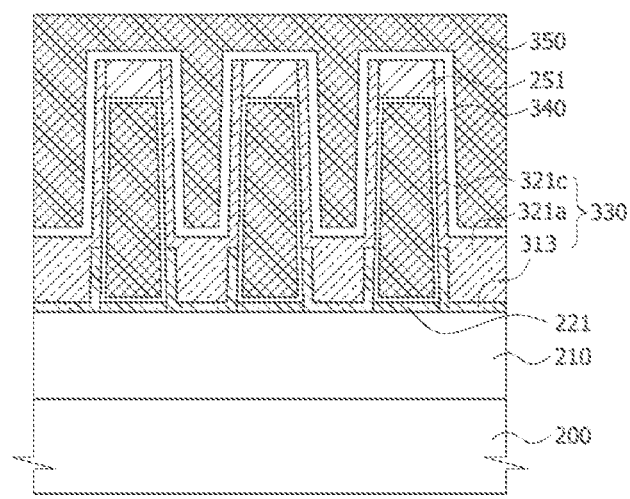

Referring to FIG. 10, a dielectric layer 340 and a plate node 350 may be sequentially formed on an entire surface of the substrate including the storage nodes 330. Accordingly, capacitors may be formed. Each of the capacitors may be formed to include one of the storage nodes 330, the dielectric layer 340, and the plate node 350. To realize MIM capacitors, the plate node 350 may be formed of a metal layer.

Figure 11:
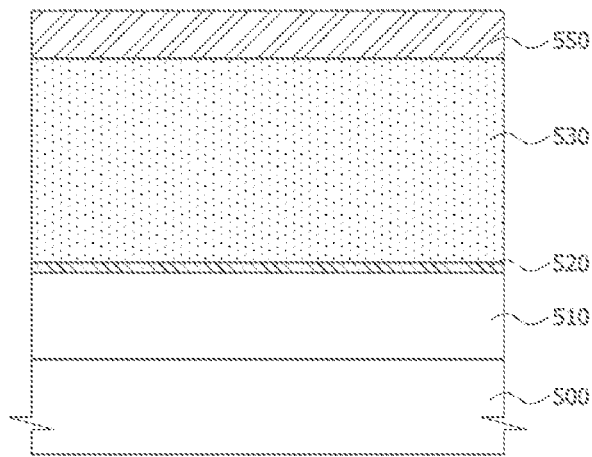
FIGS. 11 to 18 are cross sectional views illustrating an exemplary method of fabricating a storage node in a semiconductor device according to an embodiment of the invention and an exemplary method of fabricating a capacitor using the same.

FIGS. 11 to 18 are cross sectional views illustrating an exemplary method of fabricating a storage node in a semiconductor device according to an embodiment of the invention and an exemplary method of fabricating a capacitor using the same. Referring to FIG. 11, an insulation layer 510 may be formed on a semiconductor substrate 500 that may be, for example, a silicon substrate. An etch stop layer 520 may be formed on the insulation layer 510. The etch stop layer 520 may be formed of a material having an etch selectivity with respect to a sacrificial layer formed in a subsequent process. In an embodiment, the etch stop layer 520 may be formed of a nitride layer. A sacrificial layer 530 may be formed on the etch stop layer 520. The sacrificial layer 530 may be formed to have a thickness of at least 18000 Å. When the etch stop layer 520 is formed of a nitride layer, the sacrificial layer 530 may be formed of an oxide layer. The sacrificial layer 530 may be formed of a single layer, as illustrated in FIG. 11. However, the sacrificial layer 530 may also be formed to have a multi-layered structure. A supporting layer 550 may be formed on the sacrificial layer 530. The supporting layer 550 may prevent storage nodes formed in a subsequent process from leaning or falling down. The supporting layer 550 and the etch stop layer 520 may be formed, for example, from the same type of material.

Figure 12:
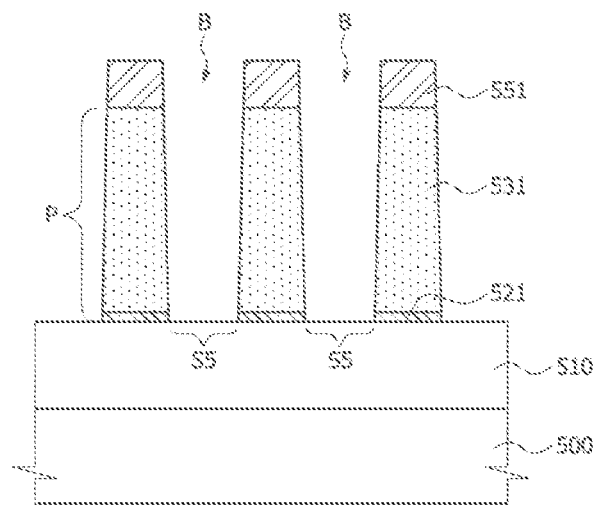

Referring to FIG. 12, after an etch mask pattern (not shown) is formed on the supporting layer 550 (FIG. 11), the supporting layer 550 and the sacrificial layer 530 (FIG. 11) may be etched using the etch mask pattern as an etch mask. While the sacrificial layer 530 is etched, the etch stop layer 520 may also be etched to expose some portions of the interlayer insulation layer 510. As a result of the etching process, an etch stop layer pattern 521, a sacrificial layer pattern 531, and a supporting layer pattern 551 may be formed to be sequentially stacked. The etch stop layer pattern 521, the sacrificial layer pattern 531, and the supporting layer pattern 551 may define a plurality of storage node contact holes B that expose some portions of the interlayer insulation layer 510. As described above, the sacrificial layer 530 may be formed to have a thickness of at least 18000 Å. Thus, the storage node contact holes B may also be formed to have a depth of at least 18000 Å. If the depth of the storage node contact holes B increases to be more than about 18000 Å without increase of top widths of the storage node contact holes B, a bottom surface of each the storage node contact holes B may not have a sufficient area S5 to allow a dielectric layer formed in a subsequent process to conformally cover inner surfaces of storage node contact holes B. This is because the storage node contact holes B are formed to have a sloped sidewall profile P. That is, a width of each of the storage node contact holes B may be gradually reduced toward the interlayer insulation layer 510. The sloped sidewall profile P may be due to the nature of an etching process. Although not shown in the drawings, storage node contacts may be formed to penetrate the interlayer insulation layer 510 and may be electrically connected to impurity regions in the semiconductor substrate 500. In the event that the storage node contacts are disposed in the interlayer insulation layer 510, the storage node contact holes B may be formed to expose respective ones of the storage node contacts.

Figure 13:
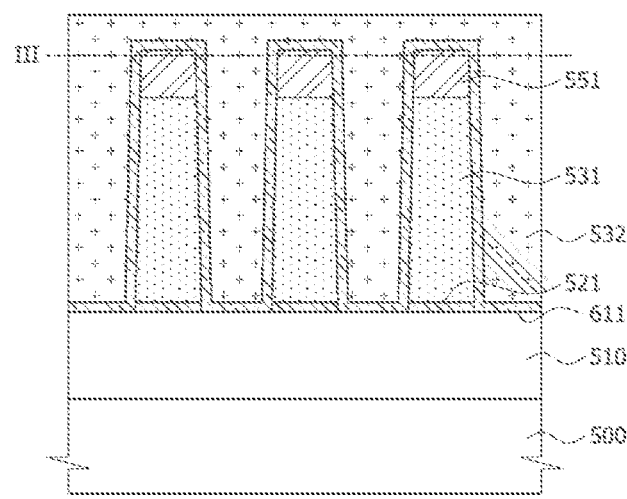

Referring to FIG. 13, a storage node conductive layer 611 may be formed on an entire surface of the substrate including the storage node contact holes B (FIG. 12). In an exemplary embodiment, the storage node conductive layer 611 may be formed of a metal layer for an electrode of a capacitor having a metal-insulator-metal (MIM) structure. For example, the storage node conductive layer 611 may be formed of a metal nitride layer such as a titanium nitride (TiN) layer. In the event that the storage node conductive layer 611 is formed of a TiN layer, the TiN layer may be formed, for example, to a thickness of about 50 Å to about 150 Å using an appropriate process such as an atomic layer deposition (ALD) process or a chemical vapor deposition (CVD) process. Subsequently, a conductive layer 532 may be formed on the storage node conductive layer 611. The conductive layer 532 may be formed to fill the storage node contact holes B surrounded by the storage node conductive layer 611. The conductive layer 532 may be formed of a material layer having an excellent etch selectivity with respect to the storage node conductive layer 611. For example, when the storage node conductive layer 611 is formed of a TiN layer, the conductive layer 532 may be formed of a polysilicon layer having an excellent wet etch selectivity with respect to the TiN layer.

Figure 14:
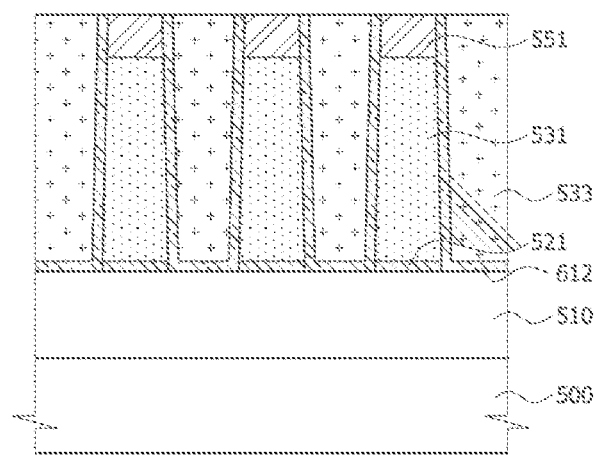

Referring to FIG. 14, the conductive layer 532 and the storage node conductive layer 611 may be planarized to expose the supporting layer pattern 551. The planarization process may be performed, for example, until the materials on a level indicated by a dotted line III (FIG. 13) are removed. The planarization process may be performed using, for example, a chemical mechanical polishing (CMP) process. As a result of the planarization process, the conductive layer 532 and the storage node conductive layer 611 above the dotted line III may be removed to form storage node conductive patterns 612 separated from each other and conductive patterns 533 surrounded by the storage node conductive patterns 612.

Figure 15:
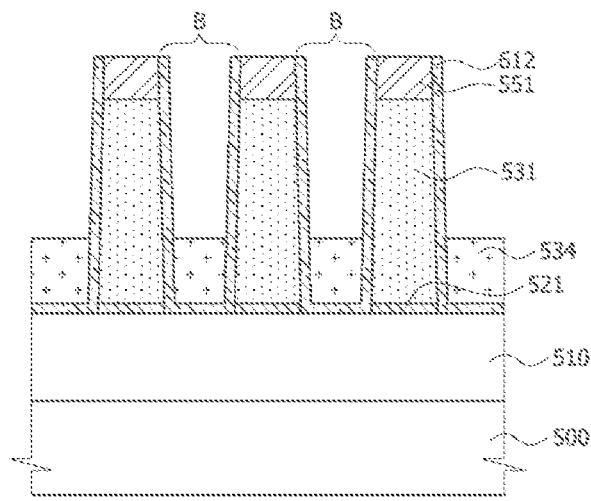

Referring to FIG. 15, the conductive patterns 533 (FIG. 14) may be recessed to form recessed conductive patterns 534 in the respective storage node contact holes B. If the conductive patterns 533 are formed of a polysilicon layer, the conductive patterns 533 may be recessed using, for example, an ammonium hydroxide ($NH_4OH$) solution as an etchant. The ammonium hydroxide ($NH_4OH$) solution may be formed, for example, by mixing de-ionized water ($H_2O$) and ammonia ($NH_3$) in a volume ratio of about 1:5 to about 1:30. The conductive patterns 533 may be recessed by a predetermined depth such that a top surface area of each of the recessed conductive patterns 534 has a sufficient area to allow a dielectric layer formed in a subsequent process to conformally cover inner surfaces of the storage node contact holes B on the recessed conductive patterns 534. In an embodiment, the recessed conductive patterns 534 may be formed, for example, to have a height of about 3000 Å to about 7000 Å.

Figure 16:
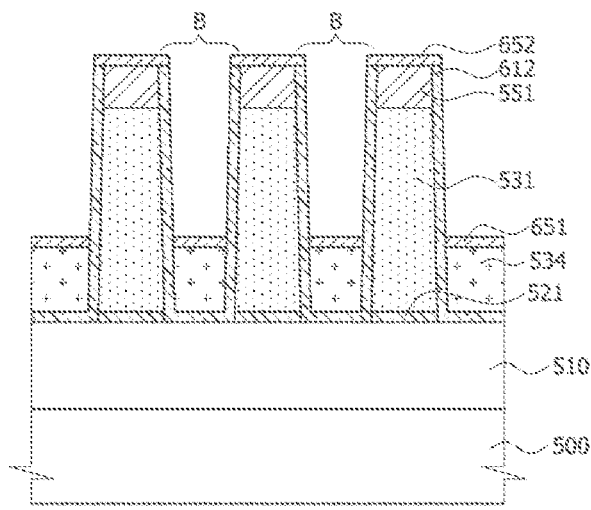

Referring to FIG. 16, a metal layer 651 and a metal layer 652 may be formed on top surfaces of the recessed conductive patterns 534 and on a top surface of the supporting layer pattern 551, respectively. The metal layers 651 and 652 may be formed of a TiN layer having a thickness, for example, of about 50 Å to about 100 Å. The metal layers 651 and 652 may be formed using, for example, a physical vapor deposition (PVD) process that exhibits a poor step coverage characteristic, such as, for example, IMP (Ionized Metal Plasma) deposition process. Thus, the metal layers 651 and 652 may not be formed on inner sidewalls of the storage node conductive patterns 612. Accordingly, the metal layer 651 and the metal layer 652 may be formed only on the top surfaces of the recessed conductive patterns 534 and on the top surface of the supporting layer pattern 551, respectively. If the recessed conductive patterns 534 are formed of a metal layer having a low resistivity, the process of forming the metal layers 651 and 652 may be omitted.

Figure 17:
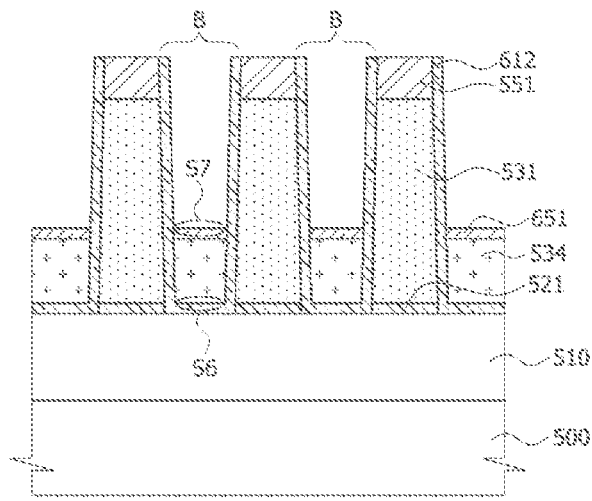

Referring to FIG. 17, the metal layer 652 (FIG. 16) may be removed using, for example, a planarization process, to expose the supporting layer pattern 551. As a result of the planarization process, the storage node conductive patterns 612 may be electrically insulated from each other. The storage node conductive patterns 612 may be disposed in the respective storage node contact holes B, and the recessed conductive patterns 534 may be disposed to fill the respective lower portions of spaces surrounded by the storage node conductive patterns 612. Further, the metal layer 651 may be disposed on the top surfaces of the recessed conductive patterns 534. Consequently, the storage node conductive pattern 612, the recessed conductive pattern 534, and the metal layer 651 disposed in each of the storage node contact holes B may constitute a storage node. As illustrated in FIG. 17, the storage node conductive pattern 612 may have a cylindrical structure, and the recessed conductive pattern 534 may have a pillar-shaped structure.

Subsequently, the supporting layer pattern 551 may be patterned to form openings that expose some portions of the sacrificial layer pattern 531, and the sacrificial layer pattern 531 may be removed using, for example, a full dip out process. According to FIG. 17, the sacrificial layer pattern 531 is illustrated as if the sacrificial layer pattern 531 includes a plurality of portions separated from each other. However, the portions of the sacrificial layer pattern 531 are physically connected to each other when viewed from a three dimensional drawing. Thus, the sacrificial layer pattern 531 may be removed by supplying an etchant through the openings in the supporting layer pattern 551.

If the depths of the storage node contact holes B are greater than 18000 Å without increase of upper widths, a bottom surface area S6 of each of the storage node conductive patterns 612 may not be sufficient to allow a dielectric layer and a plate node formed in subsequent processes to conformally cover inner surfaces of the storage node contact holes B. However, according to the present embodiment, a top surface area S7 of each of the metal layers 651 may be sufficient to allow a dielectric layer and a plate node formed in subsequent processes to conformally cover inner surfaces of the storage node contact holes B on the metal layers 651. The top surface area S7 of each metal layer 651 may be easily controlled by adjusting heights of the recessed conductive patterns 534.

Figure 18:
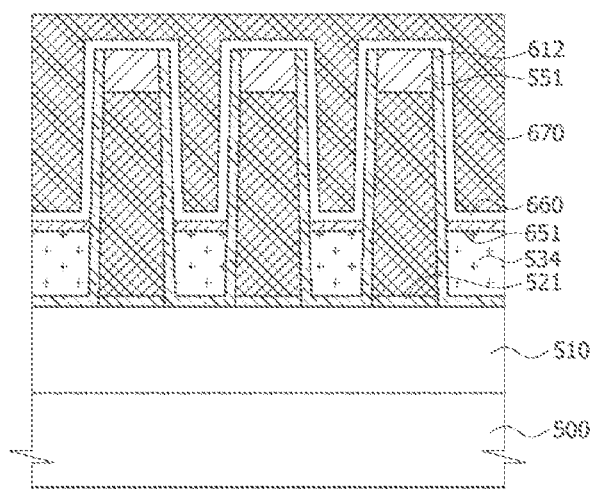

Referring to FIG. 18, a dielectric layer 660 and a plate node 670 may be sequentially formed on an entire surface of the substrate where the metal layer 652 is removed. Accordingly, capacitors may be formed. Each of the capacitors may be formed to include one of the storage nodes, the dielectric layer 660, and the plate node 670. To realize MIM capacitors, the plate node 670 may be formed of a metal layer.

According to the various exemplary embodiments set forth above, even though depths of storage node contact holes increase, pillar-shaped conductive patterns may be formed to fill the respective lower portions of the storage node contact holes. Thus, each of bottom surface areas of the storage node contact holes may increase because of the presence of the pillar-shaped conductive patterns. Accordingly, each of the bottom surfaces of the storage node contact holes may have a sufficient area to allow a dielectric layer formed in a subsequent process to conformally cover inner surfaces of the storage node contact holes.

The exemplary embodiments of the inventive concept have been disclosed above for illustrative purposes. Those skilled in the art will appreciate that various modifications, additions, and substitutions are possible without departing from the scope and spirit of the inventive concept as disclosed in the accompanying claims.

What is claimed is:

1. A method of forming a storage node in a semiconductor device, the method comprising:
    forming an interlayer insulation layer on a substrate;
    sequentially forming an etch stop layer and a first sacrificial layer on the interlayer insulation layer;
    patterning the first sacrificial layer and the etch stop layer to form a first sacrificial layer pattern and an etch stop layer pattern that define a storage node contact hole;
    forming a recessed first storage node conductive pattern that conformally covers a lower sidewall and a bottom surface of the storage node contact hole;
    forming a second storage node conductive pattern that includes a first portion surrounded by the recessed first storage node conductive pattern and a second portion conformally covering an upper sidewall of the storage node contact hole; and
    removing the first sacrificial layer pattern,
    wherein the recessed first storage node conductive pattern and the second storage node conductive pattern constitute a storage node.

2. The method of claim 1, wherein the storage node contact hole is formed to have a depth of at least 18000 angstroms (Å).

3. The method of claim 1, wherein the recessed first storage node conductive pattern is formed of a titanium nitride (TiN) layer.

4. The method of claim 3, wherein the titanium nitride (TiN) layer is formed to a thickness of about 50 angstroms (Å) to about 150 angstroms (Å) using an atomic layer deposition (ALD) process or a chemical vapor deposition (CVD) process.

5. The method of claim 1, wherein the recessed first storage node conductive pattern is formed to have a height of about 3000 (Å) to about 7000 angstroms (Å).

6. The method of claim 1, wherein the recessed first storage node conductive pattern is formed to have a cylindrical shape.

7. The method of claim 6, wherein forming the recessed first storage node conductive pattern includes:
    forming a first storage node conductive layer on a surface of the substrate including the storage node contact hole;
    forming a second sacrificial layer on the first storage node conductive layer;
    planarizing the second sacrificial layer and the first storage node conductive layer to form a first storage node conductive pattern in the storage node contact hole and a second sacrificial layer pattern surrounded by the first storage node conductive pattern;
    recessing the first storage node conductive pattern; and
    removing the second sacrificial layer pattern to expose an inner surface of the recessed first storage node conductive pattern.

8. The method of claim 7, wherein the second sacrificial layer is formed of a material having an etch selectivity with respect to the first storage node conductive layer.

9. The method of claim 8, wherein the first storage node conductive layer is formed of a titanium nitride layer and the second sacrificial layer is formed of a polysilicon layer.

10. The method of claim 9, wherein the first storage node conductive pattern is recessed using a cleaning process that employs a sulfuric acid ($H_2SO_4$) solution as a cleaning solution.

11. The method of claim 9, wherein the second sacrificial layer pattern is removed using a wet etching process that employs an ammonium hydroxide ($NH_4OH$) solution as a wet etchant.

12. The method of claim 11, wherein the ammonium hydroxide ($NH_4OH$) solution is formed by mixing de-ionized water ($H_2O$) and ammonia ($NH_3$) in a volume ratio of about 1:5 to about 1:30.

13. The method of claim 1, wherein the recessed first storage node conductive pattern and the second storage node conductive pattern are formed of the same type of material.

14. The method of claim 1, wherein the second storage node conductive pattern is formed to a thickness of about 100 Å to about 200 Å.

15. The method of claim 1, wherein the first sacrificial layer pattern is removed using a full dip out process.

16. A method of forming a capacitor in a semiconductor device, the method comprising:
    forming an interlayer insulation layer on a substrate;

forming an etch stop layer and a first sacrificial layer on the interlayer insulation layer;

patterning the first sacrificial layer and the etch stop layer to form a first sacrificial layer pattern and an etch stop layer pattern that define a storage node contact hole;

forming a recessed first storage node conductive pattern that conformally covers a lower sidewall and a bottom surface of the storage node contact hole;

forming a second storage node conductive pattern that includes a first portion surrounded by the recessed first storage node conductive pattern and a second portion conformally covering an upper sidewall of the storage node contact hole;

removing the first sacrificial layer pattern;

forming a dielectric layer on a surface of the substrate where the first sacrificial layer pattern is removed; and forming a plate node on the dielectric layer, wherein the recessed first storage node conductive pattern and the second storage node conductive pattern constitute a storage node.

17. The method of claim 16, wherein forming the recessed first storage node conductive pattern includes:

forming a first storage node conductive layer on a surface of the substrate including the storage node contact hole;

forming a second sacrificial layer on the first storage node conductive layer;

planarizing the second sacrificial layer and the first storage node conductive layer to form a first storage node conductive pattern in the storage node contact hole and a second sacrificial layer pattern surrounded by the first storage node conductive pattern;

recessing the first storage node conductive pattern; and removing the second sacrificial layer pattern to expose an inner surface of the recessed first storage node conductive pattern.

* * * * *